United States Patent
Lee et al.

(10) Patent No.: US 10,879,334 B2
(45) Date of Patent: Dec. 29, 2020

(54) FLEXIBLE DISPLAY DEVICE

(71) Applicant: LG Display Co., Ltd., Seoul (KR)

(72) Inventors: MinJic Lee, Paju-si (KR); Yeseul Han, Paju-si (KR); JeongOk Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/195,410

(22) Filed: Nov. 19, 2018

(65) Prior Publication Data
US 2019/0165076 A1 May 30, 2019

(30) Foreign Application Priority Data

Nov. 29, 2017 (KR) .......................... 10-2017-0162141

(51) Int. Cl.
*H01L 51/00* (2006.01)
*H01L 27/32* (2006.01)
*G09G 3/3266* (2016.01)
*H01L 51/52* (2006.01)
*G09G 3/3275* (2016.01)

(52) U.S. Cl.
CPC ....... *H01L 27/3276* (2013.01); *G09G 3/3266* (2013.01); *H01L 51/0097* (2013.01); *H01L 51/5253* (2013.01); *G09G 3/3275* (2013.01); *G09G 2310/08* (2013.01); *G09G 2380/02* (2013.01); *H01L 2251/5338* (2013.01)

(58) Field of Classification Search
CPC ............. H01L 27/3276; H01L 51/5253; H01L 51/0097; H01L 2251/5338; G09G 3/3266; G09G 2380/02; G09G 2310/08; G09G 3/3275
See application file for complete search history.

(56) References Cited

U.S. PATENT DOCUMENTS

| 9,886,063 | B2 | 2/2018 | Yoo et al. |
| 10,026,921 | B2 | 7/2018 | Andou et al. |

(Continued)

FOREIGN PATENT DOCUMENTS

| KR | 2015-0016053 A | 2/2015 |
| KR | 2017-0013755 A | 2/2017 |

(Continued)

OTHER PUBLICATIONS

Korean Intellectual Property Office, Office Action, KR Patent Application No. 2017-0162141, dated Oct. 31, 2018, seven pages (with concise explanation of relevance).

*Primary Examiner* — Moin M Rahman
(74) *Attorney, Agent, or Firm* — Fenwick & West LLP

(57) ABSTRACT

A flexible display device is disclosed, which may prevent a crack from being generated even though a bending area is folded and prevents a gate driving circuit from being damaged and prevents a gate shift clock line from being shorted even though the crack is generated. The flexible display device comprises a substrate including a display area for displaying an image, a non-display area surrounding the display area, and a bending area. A pixel for displaying an image, an inorganic film for covering the pixel and a first organic film for covering the inorganic film are arranged on an area corresponding to the display area of the bending area, and the first organic film is arranged on an area corresponding to the non-display area of the bending area.

17 Claims, 6 Drawing Sheets

(56) References Cited

U.S. PATENT DOCUMENTS

| | | | |
|---|---|---|---|
| 2014/0217397 A1* | 8/2014 | Kwak | ................. H01L 27/1218 257/43 |
| 2017/0031389 A1 | 2/2017 | Yoo et al. | |
| 2017/0170206 A1 | 6/2017 | Lee et al. | |
| 2017/0250366 A1 | 8/2017 | Andou et al. | |
| 2018/0082632 A1* | 3/2018 | Lee | ...................... G09G 3/3233 |
| 2018/0136527 A1* | 5/2018 | Park | ................. G02F 1/136227 |

FOREIGN PATENT DOCUMENTS

| | | |
|---|---|---|
| KR | 2017-0050848 A | 5/2017 |
| KR | 2017-0071047 A | 6/2017 |
| KR | 2017-0101097 A | 9/2017 |
| KR | 2017-0120062 A | 10/2017 |

\* cited by examiner

FLEXIBLE DISPLAY DEVICE

CROSS-REFERENCE TO RELATED APPLICATIONS

This patent application claims the benefit of Republic of Korea Patent Application No. 10-2017-0162141 filed on Nov. 29, 2017, which is hereby incorporated by reference in its entirety.

BACKGROUND

Technical Field

The present disclosure relates to a flexible and/or foldable display device.

Description of the Related Art

Recently, with the advancement of multimedia, the importance of a display device has increased. In response to this trend, various types of flat panel display devices such as a liquid crystal display device, a plasma display device, and an organic light emitting display device have been commercialized. Among the flat panel display devices, the organic light emitting display device has been widely used for notebook computers, televisions, tablet computers, monitors, smartphones, portable display apparatus, and portable information apparatus, etc. due to excellent characteristics such as the thin profile, the light weight and the low power consumption characteristics.

Also, a flexible display device has recently developed. The flexible display device may bend or curve for users' convenience. Since a display area for displaying images and a non-display area may be bent or curved, various forms of images may be realized.

A gate driving circuit for supplying a scan signal to a display area and a gate shift clock line for setting an operation timing of the gate driving circuit are arranged on a non-display area of a flexible display device. The gate driving circuit and the gate shift clock line are also arranged on the non-display area included in a bending area where a substrate is bent or curved.

When the bending area of the flexible display device is repeatedly bent, a crack is generated from outside of the bending area. As the crack is propagated to the area where the gate driving circuit and the gate shift clock line of the bending area are arranged, a problem occurs in that the gate driving circuit is damaged or the gate shift clock line is shorted.

SUMMARY

The present disclosure has been made in view of the above problems, and it is an object of the present disclosure to provide a flexible and/or foldable display device that may prevent a crack from being generated even though a bending area is repeatedly bent, prevent a gate driving circuit from being damaged and prevent a gate shift clock line from being broken even though the crack is generated.

In accordance with an aspect of the present disclosure, the above and other objects can be accomplished by the provision of a flexible display device comprising: a substrate having a display area having a plurality of pixel areas configured to display an image, a non-display area surrounding the display area that is not configured to display the image, and a bending area within both a portion of the display area and a portion of the non-display area, the flexible display device configured to bend in the bending area; a pixel array layer in the display area; and an inorganic film on the substrate; wherein the bending area within the portion of the display area includes the inorganic film and the bending area within the portion of the non-display area lacks the inorganic film.

In one embodiment, a flexible display device comprises: a substrate including a bendable display area configured to display an image and a bendable non-display area that is not configured to display the image; a pixel array in the bendable display area; a plurality of gate shift clock lines in the bendable non-display area, the plurality of gate shift clock lines in direct contact with the substrate; and an inorganic film that overlaps the pixel array in the bendable display area and is non-overlapping with the plurality of gate shift clock lines in the bendable non-display area.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
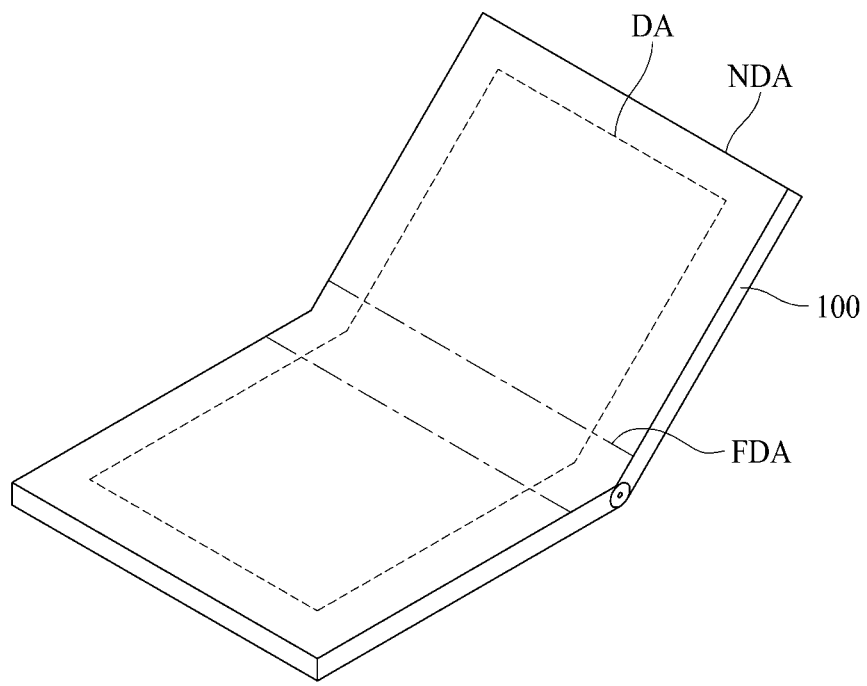
FIG. 1 is a perspective view illustrating a flexible and/or foldable display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"A first horizontal-axis direction," "a second horizontal-axis direction," and "a vertical-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of a flexible display device according to the present disclosure will be described in detail with reference to the accompanying drawings. Wherever possible, the same reference numbers will be used throughout the drawings to refer to the same or like parts.

FIG. 1 is a perspective view illustrating a flexible and/or foldable display (hereinafter just referred as the 'flexible display') device according to one embodiment of the present disclosure. The flexible display device according to one embodiment of the present disclosure includes a display panel 100, a display area DA, a non-display area NDA, and a bending area FDA.

The display panel 100 means all kinds of display substrates for displaying images using a transistor circuit. The flexible display device according to the present disclosure may be realized as an organic light emitting display. However, without limitation to this example, the flexible display device according to the present disclosure may be applied to a quantum dot display device, a micro light emitting diode (μ-LED) display device, etc.

The display area DA is provided on an entire surface of the display panel 100. The display area DA is an area for displaying images. Pixels may be provided on the display area DA to display images.

The non-display area NDA is arranged outside the display area DA to surround the display area DA. Circuits for supplying the driving signals and the driving voltages are provided on the non-display area to display an image on the display area DA.

The bending area FDA is defined in the display area DA and the non-display area NDA. The bending area FDA defines an area where the display panel 100 is configured to bend or curve. The bending area FDA is an area where the display panel 100 may be folded or bent. The bending area FDA may be formed to cross the display area DA and the non-display area NDA. The bending area FDA may be formed from one corner of the display panel 100 to the other corner thereof when the panel 100 is folded or bent. In this case, the bending area FDA is formed to be extended from a boundary outside the non-display area NDA to cross one side of the display area DA to the other side thereof.

For example, when a center portion of the display panel 100 is bent, the bending area FDA may be defined to cross a center portion of the display area DA and the display area NDA.

In the bending area FDA, the display panel 100 may be bent in a Z-axis direction which is a height direction, folded to have a predetermined curvature, or folded to have a predetermined inclined angle. When the display panel 100 is bent in a Z-axis direction in the bending area FDA, an image may be displayed in a state that the display area DA is protruded in a height direction. When the display panel 100 is folded to have a predetermined curvature in the bending area FDA, the display area DA may be maintained in a folded state toward an inner surface. When the display panel 100 is folded to have a predetermined inclined angle in the bending area FDA, the display area DA may be maintained at a predetermined inclination to display an image. Therefore, the flexible display device may realize various types of images and stereoscopic images as compared with a flat panel display device.

Figure 2:
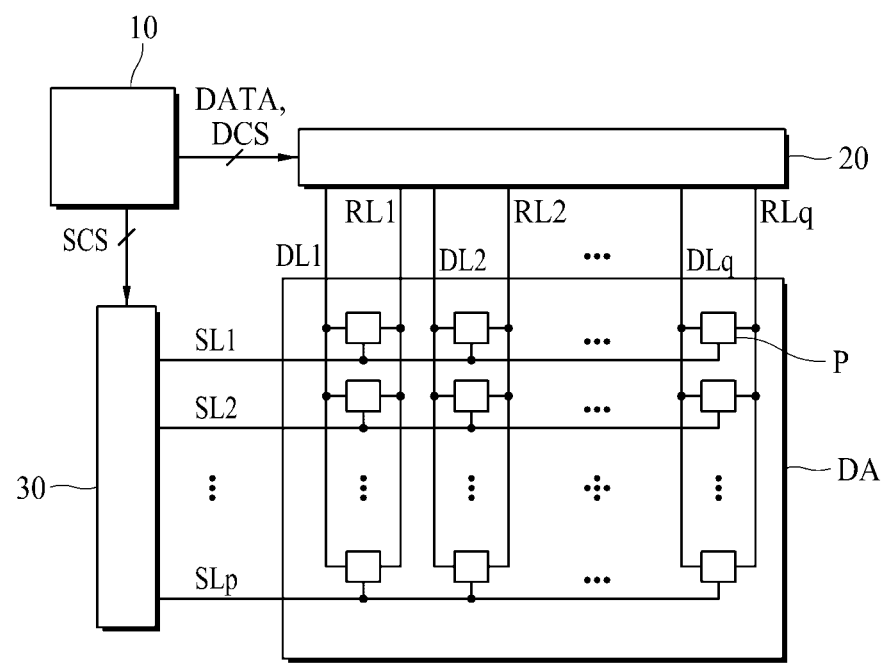
FIG. 2 is a block diagram illustrating a structure of a flexible and/or foldable display device according to one embodiment of the present disclosure.

FIG. 2 is a block diagram illustrating a structure of a flexible display device according to one embodiment of the present disclosure. The flexible display device according to one embodiment of the present disclosure includes a display area DA, a timing controller 10, a data driving circuit 20, and a gate driving circuit 30. Although some blocks according to the function of each element are shown in FIG. 2, the timing controller 10, the data driving circuit 20 and the gate driving circuit 30 may be realized as a driver integrated circuit (IC) which is a single driving chip packaged in an outer area of the display area DA of the organic light emitting display device.

On the display area DA, scan lines SL1 to SLp (p is a positive integer of 2 or more) for supplying scan signals, data lines DL1 to DLq (q is a positive integer of 2 or more) for supplying data voltages, and driving power lines RL1 to RLq for supplying a driving power are arranged. The data lines DL1 to DLq and driving power lines RL1 to RLq may cross the scan lines SL1 to SLp. The data lines DL1 to DLq may be parallel to the driving power lines RL1 to RLq. The display area DA may include a lower substrate where pixels are arranged and an upper substrate for performing an encapsulation function.

Each of pixels P may be connected to any one of the scan lines SL1 to SLp, any one of the data lines DL1 to DLq, and any one of the driving power lines RL1 to RLq. Each of the pixels P may include an organic light emitting diode (OLED) and a pixel circuit for supplying a current to the organic light emitting diode (OLED).

The timing controller 10 generates digital video data DATA for realizing images on the organic light emitting display device and timing signals for controlling a driving timing of the organic light emitting display device. The timing signals include a vertical sync signal, a horizontal sync signal, a data enable signal, and a dot clock.

The timing controller 10 generates a data control signal DCS for controlling an operation timing of the data drive 20 using the timing signals and a scan control signal SCS for controlling an operation timing of the gate drive 30. The timing controller 10 outputs the digital video data DATA and the data control signal DCS to the data driver 20. The timing controller 10 outputs the scan control signal SCS to the gate drive 30.

The data driver 20 receives the data control signal DCS from the timing controller 10. The data driver 20 generates data voltages based on the data control signal DCS. The data driver 20 supplies the data voltages to the data lines DL1 to DLq.

The gate driver 30 receives the scan control signal SCS from the timing controller 10. The gate driver 30 generates scan signals based on the scan control signal SCS. The gate driver 30 supplies the scan signals to the scan lines SL1 to SLp.

As described above, the timing controller 10, the data driver 20, and the gate driver 30 are packaged in the external area of the display area DA of the organic light emitting display device. In this case, the timing controller 10, the data driver 20, and the gate driver 30 may be packaged in the non-display area NDA which is an external area surrounding the display area DA by a gate drive in panel (GIP) method.

The driver IC in which the data driver 20 and the gate driver 30 are packaged may be connected to a flexible printed circuit board (FPCB). The flexible printed circuit board may be attached to a front edge area and a rear edge area inside the organic light emitting display device.

In this case, the timing controller 10 may be packaged on the flexible printed circuit board, and the data control signal DCS and the scan control signal SCS may be transferred from a control printed circuit board to the driver IC. The flexible printed circuit board is arranged at the edge area inside the organic light emitting display device in a folded state. Therefore, the flexible printed circuit board may be packaged even without providing a separate space inside the organic light emitting display device. Also, if the timing controller 10 is packaged on the flexible printed circuit board, a function performed by a circuit inside the driver IC may be reduced, whereby the size of the driver IC may be reduced.

Figure 3:
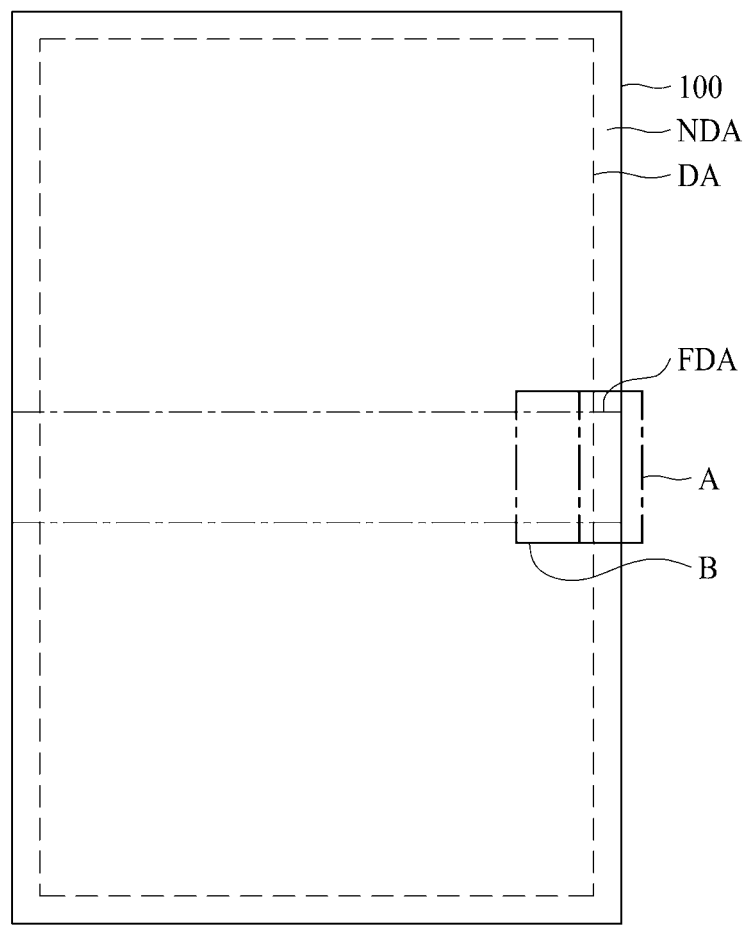
FIG. 3 is a plane view illustrating a flexible and/or foldable display device according to one embodiment of the present disclosure.
Figure 4:
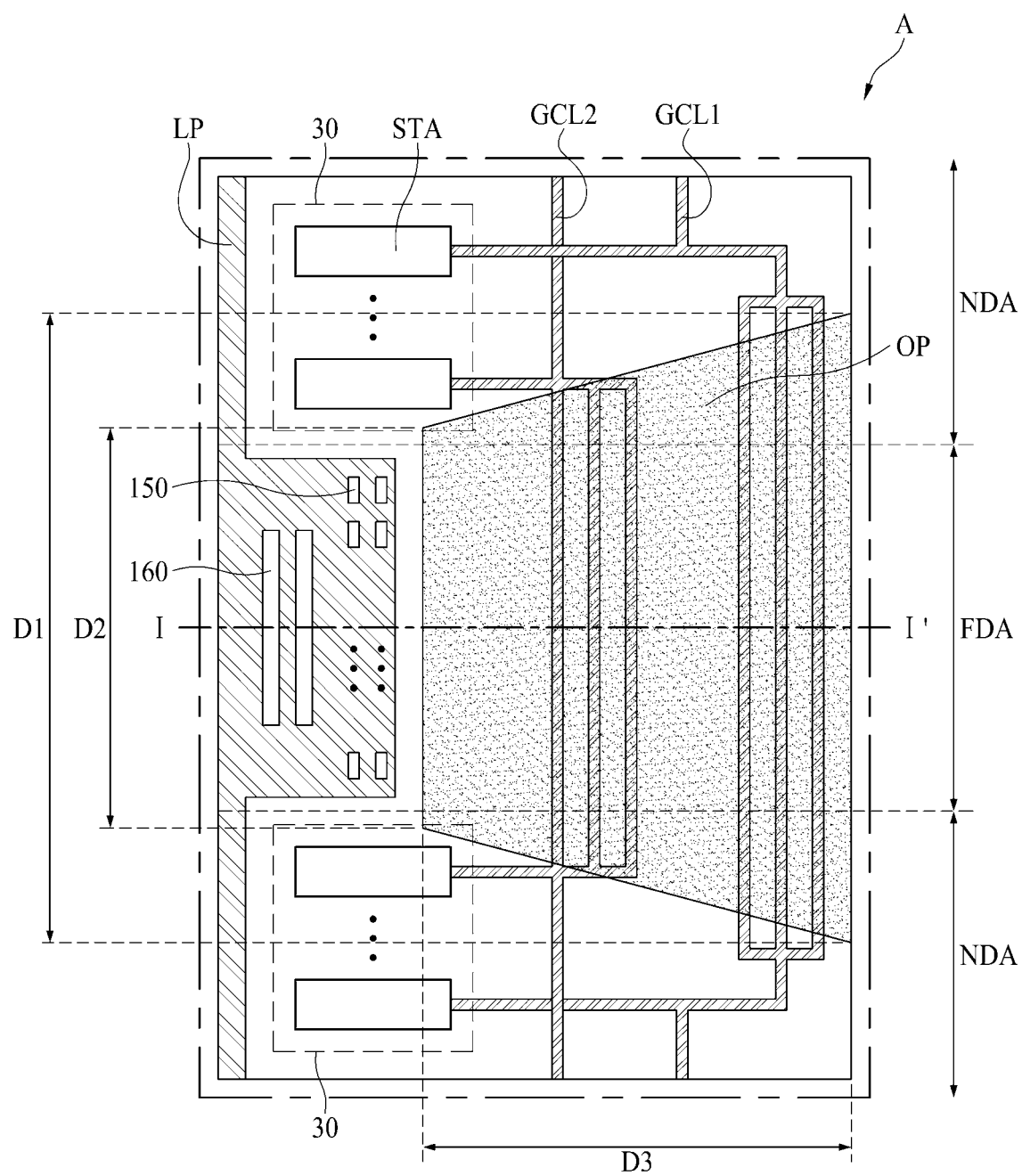
FIG. 4 is an enlarged view illustrating an area 'A' of FIG. 3 according to one embodiment.
Figure 5:
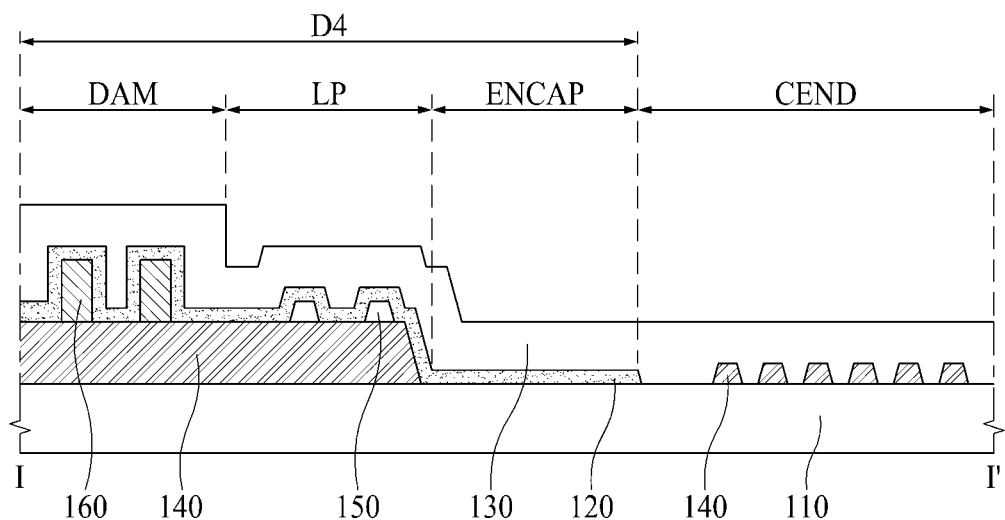
FIG. 5 is a cross-sectional view taken along line I-I' of FIG. 4 according to one embodiment.

FIG. 3 is a plane view illustrating a flexible display device according to one embodiment of the present disclosure. FIG. 4 is an enlarged view illustrating an area 'A' of FIG. 3 according to one embodiment. FIG. 5 is a cross-sectional view taken along line I-I' of FIG. 4.

The area 'A' of FIG. 3 indicates mainly a non-display area NDA of a bending area FDA of the flexible display device according to one embodiment. Gate shift clock lines GL1 and GL2 are arranged on the non-display area NDA of the gate driving circuit according to the present disclosure. Two gate shift clock lines GCL1 and GCL2 are shown in FIG. 4. However, the number of gate shift clock lines GCL1 and GCL2 may be more than 2 without limitation to the example of FIG. 3.

The gate shift clock lines GCL1 and GCL2 supply a gate clock corresponding to a scan control signal SCS to the gate driving circuit 30. The gate shift clock lines GCL1 and GCL2 set an operation timing of the gate driving circuit 30 by using the gate clock.

The gate shift clock lines GCL1 and GCL2 are arranged on the non-display area NDA. The gate shift clock lines GCL1 and GCL2 are arranged in parallel with a direction of a stage STA of the gate driving circuit 30 to supply the gate clock to a plurality of gate driving circuits 30.

The gate shift clock lines GCL1 and GCL2 may be arranged as much as the number of phases of the gate clock signal. For example, when the gate driving circuit 30 is realized by four phases, four gate shift clock lines GCL1 and GCL2 may be arranged. Each of the gate shift clock lines GCL1 and GCL2 supplies a gate clock signal corresponding to each phase to the stage STA. The gate clock signals of different phases are supplied to adjacent stages STA. For example, when the gate driving circuit 30 is realized by four phases, each of four adjacent stages is supplied with the gate clock signals of one to four phases.

A substrate 110 may be a flexible substrate. For example, the substrate 110 may be formed of a polymer material or a plastic material such as polyimide (PI).

A pixel array for displaying an image is provided on the display area DA. The pixel array is arranged on the substrate 110. An image is displayed even on the area corresponding to the display area DA of the bending area FDA. Therefore, a pixel array is arranged even on the area corresponding to the display area DA of the bending area FDA in the same structure as that of the pixel arranged on the substrate 110.

An encapsulation layer for covering a pixel array layer is arranged on the display area DA. The encapsulation layer has a first inorganic film 120, a first organic film 130 and a second inorganic film, which are deposited in due order. Therefore, the first inorganic film 120 is arranged above the pixel array layer. The first inorganic film 120 protects the pixel array from external particles such as oxygen and water. The first inorganic film 120 forms a lower layer of the encapsulation layer that protects the pixel array layer. The first inorganic film 120 is formed even on the area corresponding to the display area DA of the bending area FDA to protect a pixel. Therefore, the first inorganic film 120 fully covers an upper portion of the display area DA of the substrate 110 on which the pixel array layer is formed.

The first inorganic film 120 may be formed of an inorganic substance having low reactivity with the external foreign materials such as oxygen, moisture and water to protect the pixel array layer. The first inorganic film 120 may be formed of a material such as $SiO_2$, SiNx, and $TiO_2$. The first inorganic film 120 may have a predetermined hardness.

The first organic film 130 is arranged on the first inorganic film 120. The first organic film 130 protects the substrate 110 and the first inorganic film 120 from external physical impact. The first organic film 130 forms an intermediate layer of the encapsulation layer that protects the pixel array layer. The first organic film 130 is formed to protect the pixel array layer even on the area corresponding to the display area DA of the bending area FDA. The first organic film 130 may be formed of an organic substance having excellent flexibility to protect the substrate 110 and the first inorganic film 120 from external impact.

The second inorganic film (not shown) may be arranged on the first organic film 130. The second inorganic film may form an upper layer of the encapsulation layer that protects the pixel array layer. The second inorganic film may be formed of an inorganic substance having low reactivity with external material such as oxygen and water to protect the pixel array layer. The second inorganic film may be formed of a material such as $SiO_2$, SiNx, and $TiO_2$. The second inorganic film may have a predetermined hardness. The substrate 110 is disposed even on the area corresponding to the non-display area NDA of the bending area FDA as a lower base layer. The substrate 110 may be a flexible substrate, and may be formed of a polymer material or a plastic material such as polyimide (PI).

The first organic film 130 is arranged on the substrate 110 in the area corresponding to the non-display area NDA of the bending area FDA.

The first organic film 130 protects the substrate from external physical impact. The first organic film 130 may be formed of an organic substance having excellent flexibility to protect the substrate 110 from external impact.

The pixel is not arranged on the area corresponding to the non-display area NDA of the bending area FDA. Therefore, the first inorganic film 120 does not need to be arranged on the area corresponding to the non-display area NDA of the bending area FDA.

However, in the related art, the encapsulation layer which includes the first inorganic film, the first organic film and the second inorganic film is integrally formed even on the area corresponding to the non-display area NDA of the bending area FDA. In this case, since the first inorganic film may have a predetermined hardness, a crack may be generated by repeated folding. The crack starts to be generated at an outer edge of the non-display area NDA of the bending area FDA. The crack generated at the outer edge of the non-display area NDA is propagated from the outside to the inside of the non-display area NDA, and may be propagated to the display area DA.

The first inorganic film and the second inorganic film according to one embodiment may be defined as the inorganic film 120. Also, a structure of an encapsulation layer in which the second inorganic film is not arranged will be described hereinafter, and the inorganic film 120 will be defined by the first inorganic film 120.

The inorganic film 120 according to one embodiment is provided on the other substrate 110 except an area OP having no inorganic film, which is overlapped with the bending area FDA defined in the non-display area NDA.

The area OP having no inorganic film is an area where the inorganic film 120 is not formed. In the area OP having no inorganic film, the first organic film 130 is only arranged on the substrate 110.

The area OP having no inorganic film is overlapped with the bending area FDA defined in the non-display area NDA. Therefore, the inorganic film 120 may be removed from the bending area FDA defined in the non-display area NDA.

When the first inorganic film 120 is not arranged on the non-display area NDA of the bending area FDA, since the first inorganic film 120, which has a predetermined hardness and is likely to generate a crack, is not arranged, a crack may be prevented from being generated.

Further, when the first inorganic film 120 is not arranged on the non-display area NDA of the bending area FDA, the first organic film 130 may be arranged on the substrate 110 to be in contact with the substrate 110. When the first organic film 130 is arranged to be directly in contact with an upper surface of the substrate 110, the first organic film 130 may protect the substrate 110 better. In addition, the first organic film 130 which is flexible may directly be coupled with the substrate 110 to prevent a crack from being generated more effectively.

For example, referring to FIGS. 4 and 5, the first inorganic film 120 may be removed from the bending area FDA of the area corresponding to the non-display area NDA, whereby polyimide (PI) of the substrate 110 may be directly exposed to the first organic film 130.

The area where polyimide (PI) is directly exposed to the first organic film 130, that is, the area where the first inorganic film 120 is removed is formed along the bending area FDA from the outside of the non-display area NDA. The area where polyimide (PI) is directly exposed to the first organic film 130 may be formed to be wider at the outside of the non-display area NDA, and may be formed to be narrower at the bending area FDA adjacent to the display area DA. The first inorganic film 120 of the outer area of the non-display area NDA, which is vulnerable to occurrence of a crack, may be removed to effectively suppress occurrence of the crack.

Based on a first length direction which is an extension direction of the gate shift clock lines GCL1 and GCL2 of the substrate 100 according to one embodiment, a length of the area OP having no inorganic film is longer than that of the bending area FDA defined in the non-display area NDA. The area OP having no inorganic film fully covers the bending area FDA. Also, the area OP having no inorganic film is partially extended onto the non-display area NDA adjacent to the bending area FDA.

A length of the area OP having no inorganic film in a first length direction is a first distance D1 outside the non-display area NDA. Also, the length of the area OP having no inorganic film is a second distance D2 at the boundary where the area OP having no inorganic film ends and the inorganic film 120 starts to be arranged.

The first and second distance D1 and D2 are longer than the length of the bending area FDA defined in the non-display area NDA. Therefore, a crack may be prevented from being generated in the bending area FDA defined in the non-display area NDA. Further, since the inorganic film 120 is arranged on the non-display area NDA adjacent to the bending area FDA, the crack may be prevented from being propagated to the bending area FDA after the crack is generated.

In addition, the first distance D1 is longer than the second distance D2. Therefore, the length of the inorganic film 120 removed from the outside of the non-display area NDA where a crack is likely to be generated becomes longer, whereby the crack may be prevented from propagated to the bending area FDA more certainly.

The area OP having no inorganic film has a third distance D3 in a second length direction which is perpendicular to the first length direction. The third distance D3 is less than a width of the non-display area NDA.

Referring to FIG. 5, the first inorganic film 120 according to one embodiment may be arranged to reach an area spaced apart from the display area DA as much as a fourth distance D4 within the area corresponding to the non-display area NDA.

To increase a folding capability of the bending area FDA of the flexible display device, the area where the first inorganic film 120 is removed should be enlarged from the non-display area NDA. When the first inorganic film 120 is not arranged on the non-display area NDA of the bending area FDA, the bending area FDA has excellent folding property. When the first inorganic film 120 is not arranged on the non-display area of the bending area FDA, the bending area FDA may have optimal folding property.

However, when the first inorganic film 120 is not arranged on the non-display area of the bending area FDA, the foreign particles such as external oxygen, moisture and water may be permeated through a side edge area of the non-display area NDA of the bending area FDA from which the first inorganic film 120 is removed. The permeated foreign particles may be propagated into the inside from the side edge of the non-display area NDA of the bending area FDA. When the particles are permeated into the area spaced apart from the display area DA as much as the fourth distance D4, a problem may occurs in that picture quality of the display area DA may be deteriorated by the particles.

The gate driving circuit 30 is arranged inside the area spaced apart from the display area DA as much as the fourth distance D4. The first inorganic film 120 for preventing an external foreign material from being permeated into the gate driving circuit 30 should be arranged. The fourth distance D4 may be 0.5 mm or more and 1.0 mm or less. Therefore, the first inorganic film 120 may be arranged as much as the fourth distance D4 which is a minimum distance for protecting the gate driving circuit 30.

The fourth distance D4 includes a dam area DAM, a line pattern area LP, and an encapsulation area ENCAP.

A dam 160 is arranged in the dam area DAM. The dam 160 according to one embodiment is provided on the bending area FDA between the display area DA and the area OP having no inorganic film. Since layers, which are formed by inkjet method among layers constituting the display area DA, have mobility, the dam 160 prevents the layers from being permeated into the bending area FDA. Therefore, the dam 160 prevents an unnecessary layer from being formed in the bending area FDA.

The line pattern area LP is an area in which a line for transferring a signal is patterned in the non-display area NDA. A crack propagation blocking portion 150 is arranged in the line pattern area LP. The crack propagation blocking portion 150 is provided on the bending area FDA between the display area DA and the area OP having no inorganic film. The crack propagation blocking portion 150 includes a plurality of crack propagation blocking patterns. The crack propagation blocking portion 150 is provided on a first metal layer 140. The crack propagation blocking portion 150 is provided under the first inorganic film 120.

The encapsulation area ENCAP is an area for defining an end of the first inorganic film 120. The inorganic film is removed from a boundary where the encapsulation area ENCAP ends.

The gate driving circuit 30 according to one embodiment is provided in the non-display area NDA. In more detail, the gate driving circuit 30 is arranged in the area except the bending area FDA of the non-display area NDA. The gate driving circuit 30 has n stages STA (n is a natural number of 2 or more) connected with n gate lines formed in the display area DA. The stages STA constituting the gate driving circuit 30 are arranged in the non-display area. NDA except the bending area FDA. The stages STA are not arranged on the bending area FDA.

When the stages STA are arranged on the bending area FDA, the possibility that the stages STA may be damaged by repeated folding is increased. Also, when the stages STA are arranged on the bending area FDA, a problem occurs in that the possibility that the stages STA may be exposed to particles permeated into a side in accordance with removal of the first inorganic film 120 outside the non-display area NDA of the bending area FDA is increased.

The gate driving circuit 30 according to one embodiment is arranged only in the non-display area NDA which does not correspond to the bending area FDA, without being arranged in the bending area FDA. Therefore, the stages STA according to one embodiment are not affected by folding even in the case that the flexible display device is repeatedly folded. Also, the stages STA may be prevented from being exposed to the particles permeated into the side in accordance with removal of the organic film 120.

For example, among n stages STA, the ith (i is a natural number that satisfies 1<i<n) and (i+1)th stage STA are spaced apart from each other by interposing the bending area FDA therebetween. Therefore, a structure that the stages STA are not arranged in the bending area FDA may be realized, and a problem that a circuit device such as a transistor constituting stages STA is damaged by repeated folding in the bending area FDA may be solved.

Also, for example, as shown in FIG. 4, the flexible display device may further include a crack propagation blocking portion 150 provided in the bending area FDA between the ith stage STA and the (i+1)th stage STA. Since the stages STA are not arranged in the bending area FDA, the crack propagation blocking portion 150 is arranged in the area where the stages STA are not arranged, whereby a crack may be prevented from being generated and propagated in the bending area FDA more certainly.

The area OP having no inorganic film according to one embodiment includes the bending area FDA between the ith stage STA and the (i+1)th stage STA. The inorganic film 120 is fully removed from the bending area FDA between the ith stage STA and the (i+1)th stage STA. As the inorganic film 120 is not arranged, the crack may be prevented from being generated even though the bending area FDA between the ith stage STA and the (i+1)th stage STA is repeatedly bent. In this case, a problem that the stages STA are directly damaged by the crack generated in the area adjacent to the stages STA of the bending area FDA may be solved.

The area further away from the display area DA than the fourth distance D4 is a cell outside area CEND. The gate shift clock lines GCL1 and GCL2 are arranged in the cell outside area CEND. The gate shift clock lines GCL1 and GCL2 are comprised of the first metal layer 140.

The plurality of gate shift clock lines GCL1 and GCL2 are connected with the gate driving circuit 30. The first gate shift clock line GCL1 and the second gate shift clock line GCL2 supply gate shift clock signals of respective phases different from each other to the different stages STA.

Each of the plurality of gate shift clock lines GCL1 and GCL2 includes a bending line portion overlapped with the area OP having no inorganic film. In FIG. 4, all of the gate shift clock lines GCL1 and GCL2 arranged on the area overlapped with the area OP having no inorganic film correspond to the bending line portion. The gate shift clock lines GCL1 and GLC2 in the bending line portion are comprised of the first metal layer 140.

The bending line portion of each of the gate shift clock lines GCL1 and GCL2 according to one embodiment is directly in contact with a surface of the substrate 110. Since the bending line portion is provided on the area OP having no inorganic film, the inorganic film on the substrate 110 is fully removed. Therefore, the bending line portion is directly in contact with the surface of the substrate 110 which is flexible.

The bending line portion of each of the gate shift clock lines GCL1 and GCL2 according to one embodiment has a mesh type. When the bending line portion has a mesh type, even though short-circuit according to a crack is generated at a specific portion of the bending line portion of the plurality of gate shift clock lines GCL1 and GCL2 due to repeated bending, the gate shift clock signals may be supplied to the mesh line where short-circuit is not generated.

Therefore, a problem that the gate shift clock lines GCL1 and GCL2 fail to supply a gate shift clock signal may be solved.

The gate shift clock lines GCL1 and GCL2 according to one embodiment are arranged between the substrate 110 and the first organic film 130 in the bending area FDA of the non-display area NDA. In this case, the gate shift clock lines GCL1 and GCL2 on the bending line portion may be bent by bending of the flexible substrate 110 and the first organic film 130, whereby the risk of generating damage or short-circuit of the gate shift clock lines GCL1 and GCL2, which is caused by bending, may be reduced.

The gate shift clock lines GCL1 and GCL2 are directly arranged on the substrate 110, and the first organic film 130 is only arranged on the gate shift clock lines GCL1 and GCL2. The substrate 110 according to one embodiment may be a flexible plastic, and the first organic film 130 according to one embodiment may be made of a flexible organic material. Therefore, the gate shift clock lines GCL1 and GCL2 have a structure surrounded or sandwiched by flexible organic substance layers. For example, the gate shift clock lines GCL1 and GCL2 have a structure arranged between layers made of a polymer compound such as polyimide.

Therefore, the gate shift clock lines GCL1 and GCL2 may not be damaged by peripheral layers having a hardness. Also, a crack is not generated in the layers in the periphery of the gate shift clock lines GCL1 and GCL2 even though external impact is applied to the gate shift clock lines GCL1 and GCL2, propagation of the crack to the gate shift clock lines GCL1 and GCL2 may be avoided.

Figure 6:
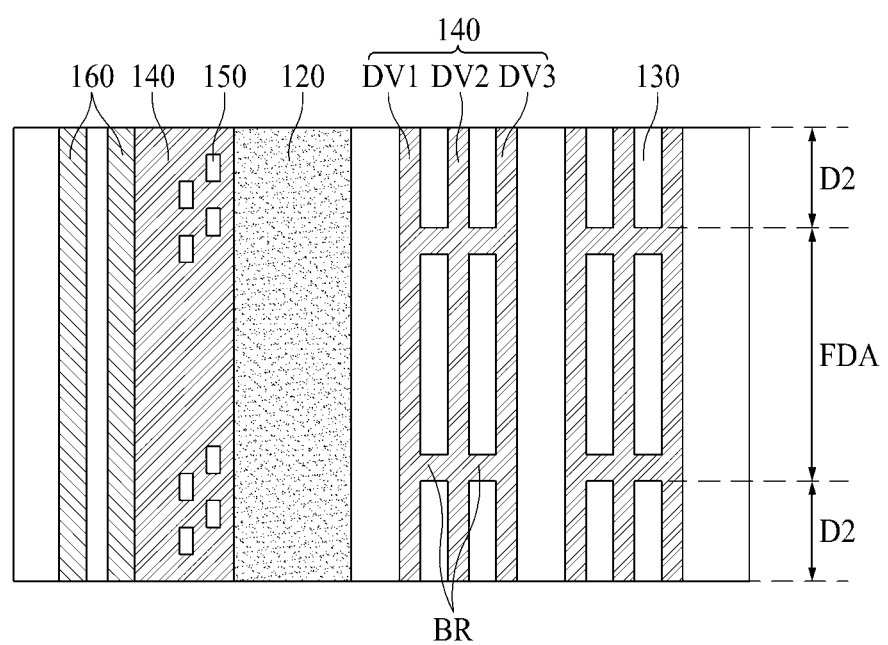
FIG. 6 is an enlarged view illustrating an area 'A' of FIG. 3 according to another embodiment.

FIG. 6 is an enlarged view illustrating an area 'A' of FIG. 3 according to another embodiment.

A gate shift clock line 140 according to another embodiment includes a plurality of divisional lines DV1, DV2 and DV3 in the bending area FDA of the non-display area NDA. In FIG. 6, one gate shift clock line 140 includes, but is not limited to, three divisional lines DV1, DV2 and DV3. The number of divisional lines DV1, DV2 and DV3 may be more than or smaller than three.

The divisional lines DV1, DV2 and DV3 are lines forked from the gate shift clock line 140 while the gate shift clock line 140 is entering the bending area FDA. The divisional lines DV1, DV2 and DV3 forked from one gate shift clock line 140 are supplied with the same signal. A width of each of the divisional lines DV1, DV2 and DV3 is narrower than that of the gate shift clock line 140.

The gate shift clock line 140 according to another embodiment is forked from the bending area FDA of the non-display area NDA and then arranged as a plurality of divisional lines DV1, DV2 and DV3. Therefore, even though a part of the divisional lines, particularly the divisional line DV3 arranged at the outside is broken by a crack caused by a physical force externally applied to the bending area FDA due to repeated folding, the gate clock signal may be transferred using the other divisional lines DV1 and DV2.

Also, a width of each of the divisional lines DV1, DV2 and DV3 according to another embodiment is narrower than that of the gate shift clock line 140. The narrow line may be folded more easily without being broken by repeated folding than the wide line. Therefore, the narrow divisional lines DV1, DV2 and DV3 stronger with respect to repeated folding of the bending area FDA may be arranged to transfer the gate clock signal more stably.

The plurality of divisional lines DV1, DV2 and DV3 according to another embodiment are connected by a plurality of bridge lines BR. The bridge line BR connect the adjacent divisional lines DV1, DV2 and DV3 with one another. The bridge line BR is formed within the bending area FDA per predetermined interval.

When the adjacent divisional lines DV1, DV2 and DV3 are connected with one another through the bridge line BR, a force against repeated folding is increased as compared with that the divisional lines DV1, DV2 and DV3 are arranged individually. Therefore, the divisional lines DV1, DV2 and DV3 may be prevented from being broken more certainly.

Also, even though a part of the divisional lines, particularly the divisional line DV3 arranged at the outside is broken by an outer crack, the other area than the outer divisional line DV3, which is not broken, may be connected with the divisional lines DV1 and DV2 adjacent to the display area DA. Therefore, the gate clock signal may be transferred more stably.

Furthermore, the first organic film 130 is exposed to the bending area FDA of the non-display area NDA and the area extended from the bending area FDA in a direction of the gate shift clock line as much as the second distance D2.

That is, the inorganic film 120 removed from the bending area FDA of the non-display area NDA and the area extended from the bending area FDA in a direction of the gate shift clock line as much as the second distance D2.

Therefore, the crack, which is generated in the bending area FDA of the non-display area NDA and the area extended from the bending area FDA in a direction of the gate shift clock line as much as the second distance D2, may certainly be prevented from being propagated to the bending area FDA.

Figure 7:
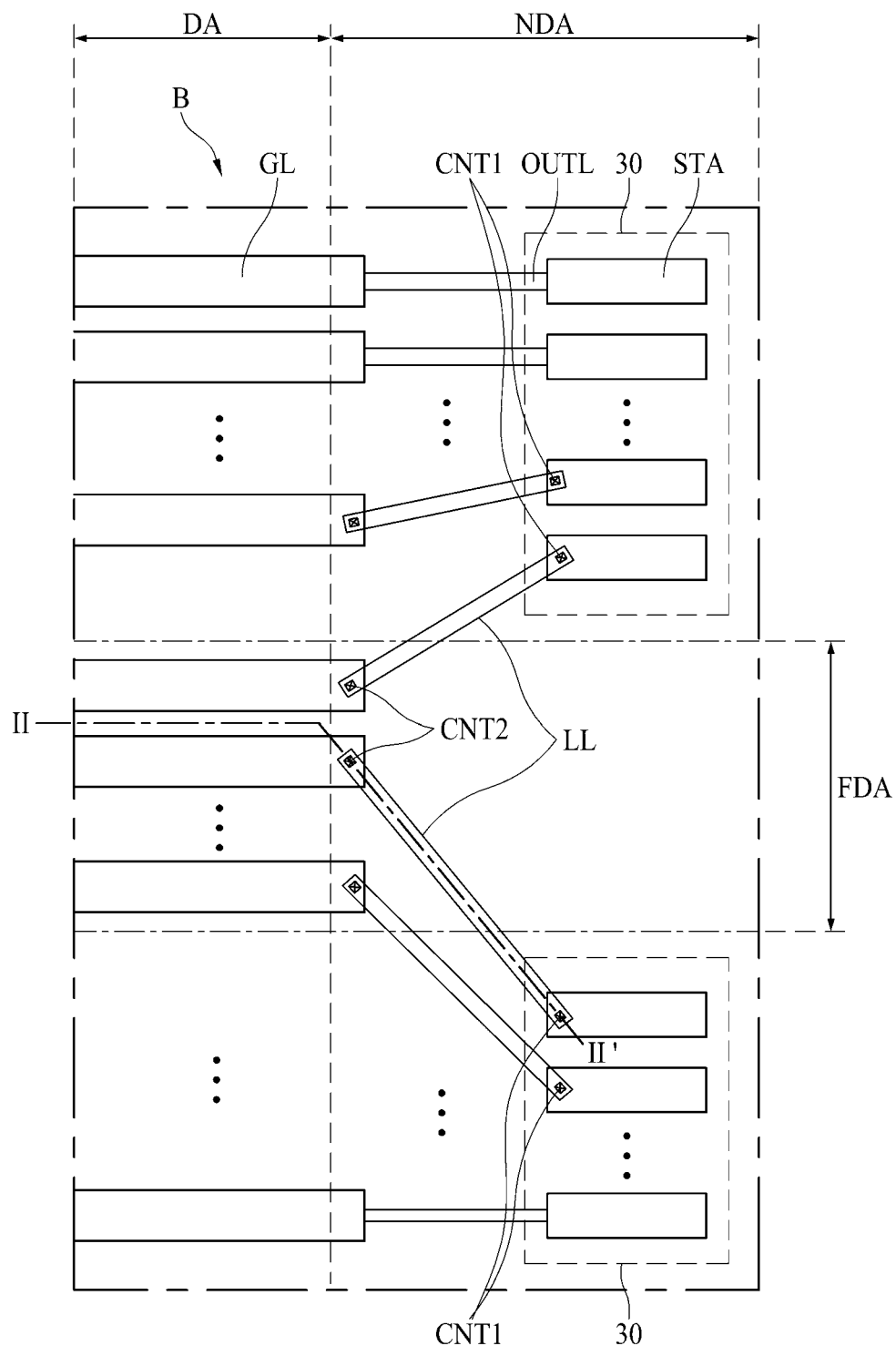
FIG. 7 is an enlarged view illustrating an area 'B' of FIG. 3 according to one embodiment.

FIG. 7 is an enlarged view illustrating an area 'B' of FIG. 3 according to one embodiment.

The display device according to one embodiment further includes a link line LL for connecting the gate driving circuit 30 with a gate line GL connected to a pixel P in the bending area FDA.

The link line LL connects an output line OUTL of the gate driving circuit 30 with the gate line GL. Since the gate driving circuit 30 is not arranged in the bending area FDA, the link line LL connects the gate driving circuit 30 with the gate line GL while forming a predetermined inclination with respect to the gate line GL.

The link line LL is comprised of source/drain layers. Therefore, the link line LL is connected to the output line OUTL of the gate driving circuit 30 through a first contact hole CNT1. Also, the link line LL is connected with the gate line GL through a second contact hole CNT2.

When the link line LL is formed of a gate metal layer, the link line is formed using Molybdenum (Mo) having low flexibility. In this case, the link line LL arranged in the bending area FDA may be broken by repeated folding.

The link line LL according to one embodiment is comprised of source/drain layers having a deposition structure (Ti/Al/Ti) of Ti and Al, which has good flexibility. Therefore, the link line LL is not broken in spite of repeated folding.

Figure 8:
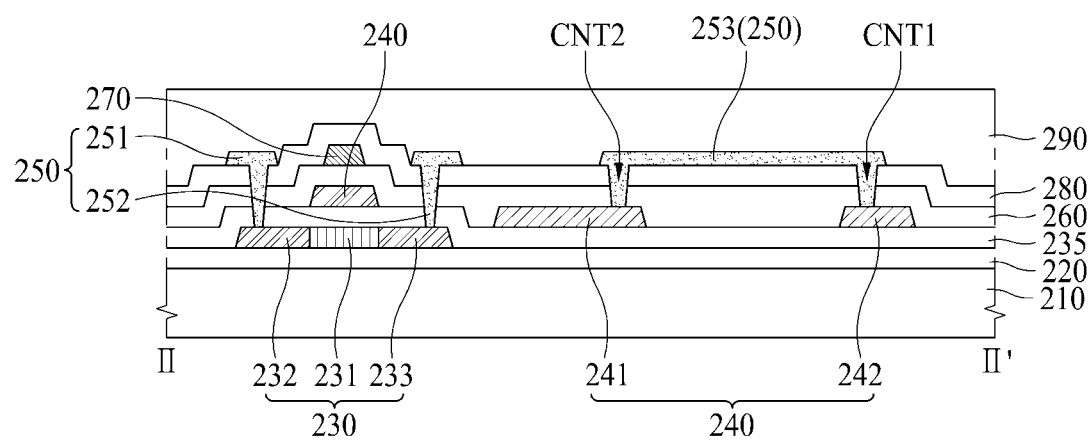
FIG. 8 is a cross-sectional view taken along line II-II' of FIG. 7 according to one embodiment.

FIG. 8 is a cross-sectional view taken along line II-II' of FIG. 7. The flexible display device according to one embodiment includes a base layer 210, a buffer layer 220, a semiconductor layer 230, a gate insulating layer 235, a first metal layer 240, a first bridge 241, a second metal layer 250, a first inter-layer dielectric film 260, a third metal layer 270, a second inter-layer dielectric film 280, a planarization film 290, and an anode electrode (not shown).

The base layer 210 forms the lowest layer of the foldable display device. The base layer 210 may support circuit devices and lines, which constitute a circuit portion provided at an upper portion. Alternatively, the base layer 210 may be formed of a flexible plastic to have flexibility.

The buffer layer 220 covers the upper portion of the base layer 210. The buffer layer 220 is formed of a material having an excellent insulation. The buffer layer 220 protects the circuit devices and lines, which constitute the circuit portion provided at the upper portion of the base layer 210, from external impact or electricity.

The semiconductor layer 230 is arranged on the buffer layer 220. The semiconductor layer 230 is made of a doped semiconductor. The semiconductor layer 230 forms a channel of a thin film transistor constituting a pixel. The semiconductor layer 230 includes a gate channel 231, a first channel 232, and a second channel 233. The gate channel 231 forms a channel of a gate electrode of the thin film transistor. The first and second electrode layers 233 form channels of a source electrode and a drain electrode of the thin film transistor.

The gate insulating layer 235 is arranged on the buffer layer 220 and the semiconductor layer 230. The gate insulating layer 235 fully covers the buffer layer 220 and the semiconductor layer 230. The gate insulating layer 235 is formed of a material having excellent insulation. The gate insulating layer 235 prevents the semiconductor layer 230 from being shorted from the first metal layer 240, and partitions the channels of the thin film transistor formed by the semiconductor layer 230.

The first metal layer 240 is arranged on the gate insulating layer 235. The first metal layer 240 is a gate metal layer that forms a gate electrode and gate lines GL1 to GLp of the thin film transistor. The first metal layer 240 may be formed of metal or alloy having excellent electric conductivity. For example, the first metal layer 240 may be formed of Mo.

A gate line 241 is arranged on the gate insulating layer 235. The gate line 241 is provided as the first metal layer 240. The gate line 241 is formed on the same layer as a layer for forming the gate electrode of the thin film transistor using the same material. The gate line 241 supplies a gate signal to pixels. The gate line 241 in FIG. 8 is corresponding to the gate line GL in FIG. 7.

An output line 242 is arranged on the gate insulating layer 235. The output line 242 is provided as the first metal layer 240. The output line 242 is formed on the same layer as the layer for forming the gate electrode of the thin film transistor using the same material. The output line 242 outputs a gate signal generated from the gate driving circuit 30. The output line 242 is connected to the stage STA.

The first inter-layer dielectric film 260 is arranged on the first metal layer 240 and the gate line 241. The first inter-layer dielectric film 260 is formed of a material having excellent electric insulation.

The third metal layer 270 is arranged on the first inter-layer dielectric film 260. The third metal layer 270 is arranged to overlap the first metal layer 240 for forming the gate electrode of the thin film transistor. The third metal layer 270 forms mutual capacitance with the first metal layer 240 for forming the gate electrode of the thin film transistor. The third metal layer 270 serves as one electrode of storage capacitance.

The second inter-layer dielectric film 280 is arranged on the first inter-layer dielectric film 260 and the third metal layer 270. The second inter-layer dielectric film 280 is formed of a material having excellent electric insulation.

The second metal layer 250 is arranged on the second inter-layer dielectric film 280. The second metal layer 250 forms a first electrode 251 and a second electrode 252 of the thin film transistor constituting pixels. The second metal layer 250 forms a link line 253. The second metal layer 250 corresponds to source/drain metal layers arranged on the first metal layer 240. The second metal layer 250 may be formed of metal or alloy having flexibility more excellent than that of the first metal layer 250. Particularly, the second metal layer 250 includes at least one of a layer made of Ti and a layer made of Al. For example, the second metal layer 250 may be formed to have a deposition structure (Ti/Al/Ti) of three layers in the order of Ti, Al and Ti.

The first and second contact holes CNT1 and CNT2 are provided in the first and second inter-layer dielectric films 260 and 280 arranged between the first and second metal layers 240 and 250. The second contact hole CNT2 is provided in an area where the gate line 241 and the link line 253 are overlapped with each other, to pass through the first and second inter-layer dielectric films 260 and 280. The second contact hole CNT2 connects the gate line 241 with the link line 253. The first contact hole CNT1 is provided in an area where the output line 242 and the link line 253 are overlapped with each other, to pass through the first and second inter-layer dielectric films 260 and 280. The first contact hole CNT1 connects the output line 242 with the link line 253. Therefore, the link line 253 may be formed as the second metal line 250 and at the same time a gate signal output from the output line 242 may be supplied to the gate line 241.

The planarization film 290 is arranged on the second inter-layer dielectric film 280 and the second metal layer 250. The planarization film 290 reduces a height difference on an upper surface. Therefore, the planarization film 290 may prevent a deviation in a height of a Z-axis direction based on the base layer 210 from being generated in accordance with an area.

As described above, according to the present disclosure, the following effects and advantages may be obtained.

In the present disclosure, the first organic film is arranged on the non-display area of the bending area, whereby a crack is not generated outside the bending area even in case of repeated folding of the bending area.

Further, the gate driving circuit is arranged in the area except the bending area even though the crack is generated outside the bending area, whereby the gate driving circuit is prevented from being damaged.

Still further, the gate shift clock line of the bending area is realized as a plurality of divisional lines, whereby the gate shift clock line is prevented from being broken.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flexible display device comprising:
a substrate having a display area having a plurality of pixel areas configured to display an image, a non-display area surrounding the display area that is not configured to display the image, and a bending area including both a portion of the display area and a portion of the non-display area, the flexible display device configured to bend in the bending area;
a pixel array layer in the display area;
an inorganic film on the substrate, wherein the portion of the display area within the bending area includes the inorganic film and the portion of the non-display area within the bending area lacks the inorganic film, and
a crack propagation blocking portion provided on the bending area between the portion of the display area and the portion of the non-display area lacking the inorganic film, the crack propagation blocking portion overlapped by the inorganic film.

2. The flexible display device of claim 1, wherein a portion of the non-display area that does not include the bending area also lacks the inorganic film.

3. The flexible display device according to claim 1, further comprising:
an encapsulation layer on the pixel array layer in the display area, the encapsulation layer including a first inorganic film, a first organic film on the first inorganic film, and a second inorganic film on the first organic filmy.

4. The flexible display device according to claim 2, further comprising:
a plurality of gate shift lines in the non-display area of the substrate that extend along a first direction, wherein a length of the non-display area that includes the portion of the non-display area that lacks the inorganic film is longer than a length of the bending area within the non-display area.

5. The flexible display device according to claim 1, wherein the first inorganic film is spaced apart from the display area by at least 5 mm and spaced apart from the non-display area by at most 1.0 mm.

6. The flexible display device according to claim 1, further comprising:
a dam provided on the bending area between the portion of the display area and the portion of the non-display area lacking the inorganic film, the dam overlapped by the inorganic film.

7. The flexible display device according to claim 1, further comprising:
a gate driving circuit provided in the non-display area, the gate driving circuit comprising n stages connected with n gate lines formed in the display area (n is a natural number of 3 or more which is equal to number of the gate lines), wherein the bending area is between an ith (i is a natural number that satisfies 1<i<n) stage and an (i+1)th stage among the n stages.

8. The flexible display device according to claim 7, further comprising:
a crack propagation blocking portion provided in the bending area between the ith stage and the (i+1)th stage.

9. The flexible display device according to claim 7, wherein the bending area between the ith stage and the (i+1)th stage lacks the inorganic film.

10. The flexible display device according to claim 7, further comprising:
a plurality of gate shift clock lines connected to the gate driving circuit, wherein each of the plurality of gate shift clock lines includes a bending line portion in the bending area of the non-display area that lacks the inorganic film, and the bending line portion of each of the plurality of gate shift clock lines is directly in contact with a surface of the substrate.

11. The flexible display device according to claim 10, wherein the bending line portion of each of the plurality of gate shift clock lines has a mesh type.

12. The flexible display device according to claim 10, wherein the bending line portion of each of the plurality of gate shift clock lines is comprised of a plurality of divisional lines.

13. The flexible display device according to claim 12, wherein the plurality of divisional lines are connected with one another by a plurality of bridge lines.

14. The flexible display device according to claim 10, wherein each of the plurality of gate shift clock lines includes a first metal layer.

15. The flexible display device according to claim 14, further comprising:
a link line that connects a gate driving circuit provided in the portion of the non-display area that includes the bending area with a gate line connected to a pixel provided in the display area, wherein the link line includes a second metal layer having a deposition structure of titanium and aluminum.

16. The flexible display device according to claim 15, wherein the link line is connected with an output line of the gate driving circuit through a first contact hole.

17. The flexible display device according to claim 15, wherein the link line is connected with the gate line through a second contact hole.

* * * * *